(12) United States Patent
Lee et al.

(10) Patent No.: US 8,896,115 B2
(45) Date of Patent: Nov. 25, 2014

(54) SEMICONDUCTOR DEVICE AND METHOD OF FORMING SHIELDING LAYER AROUND BACK SURFACE AND SIDES OF SEMICONDUCTOR WAFER CONTAINING IPD STRUCTURE

(75) Inventors: YongTaek Lee, Seoul (KR); HyunTai Kim, Kyungki Do (KR); Gwang Kim, Kyungki-Do (KR); ByungHoon Ahn, Kyungki-Do (KR)

(73) Assignee: STATS ChipPAC, Ltd., Singapore (SG)

( * ) Notice: Subject to any disclaimer, the term of this patent is extended or adjusted under 35 U.S.C. 154(b) by 185 days.

(21) Appl. No.: 13/438,463

(22) Filed: Apr. 3, 2012

(65) Prior Publication Data
US 2012/0187531 A1    Jul. 26, 2012

Related U.S. Application Data

(62) Division of application No. 12/816,190, filed on Jun. 15, 2010, now Pat. No. 8,183,130.

(51) Int. Cl.
| | | |
|---|---|---|
| *H01L 23/04* | (2006.01) | |
| *H01L 21/56* | (2006.01) | |
| *H01L 23/552* | (2006.01) | |
| *H01L 25/16* | (2006.01) | |
| *H01L 23/31* | (2006.01) | |
| *H01L 23/64* | (2006.01) | |

(52) U.S. Cl.
CPC ..... *H01L 21/561* (2013.01); *H01L 2924/01079* (2013.01); *H01L 2924/01078* (2013.01); *H01L 2224/73265* (2013.01); *H01L 2924/13091* (2013.01); *H01L 23/552* (2013.01); *H01L 2924/01322* (2013.01); *H01L 25/16* (2013.01); *H01L 23/3114* (2013.01); *H01L 23/64* (2013.01)

USPC ............................ 257/698; 257/532; 257/531

(58) Field of Classification Search
CPC ... H01L 21/561; H01L 23/64; H01L 23/3114; H01L 25/16; H01L 23/552; H01L 2924/01079; H01L 2924/01322; H01L 2924/13091; H01L 2924/01078; H01L 2224/73265
USPC .......................................... 257/531, 532, 698
See application file for complete search history.

(56) References Cited

U.S. PATENT DOCUMENTS

| | | |
|---|---|---|
| 5,347,149 A | 9/1994 | Bayraktaroglu |
| 6,261,892 B1 | 7/2001 | Swanson |
| 6,838,748 B2 | 1/2005 | Ishio et al. |
| 7,618,846 B1 | 11/2009 | Pagaila et al. |
| 8,101,460 B2 | 1/2012 | Pagaila et al. |

*Primary Examiner* — Jarrett Stark
(74) *Attorney, Agent, or Firm* — Robert D. Atkins; Patent Law Group: Atkins and Associates, P.C.

(57) ABSTRACT

A semiconductor wafer has an insulating layer over a first surface of the substrate. An IPD structure is formed over the insulating layer. The IPD structure includes a MIM capacitor and inductor. A conductive via is formed through a portion of the IPD structure and partially through the substrate. The conductive via can be formed in first and second portions. The first portion is formed partially through the substrate and second portion is formed through a portion of the IPD structure. A first via is formed through a second surface of the substrate to the conductive via. A shielding layer is formed over the second surface of the substrate wafer. The shielding layer extends into the first via to the conductive via. The shielding layer is electrically connected through the conductive via to an external ground point. The semiconductor wafer is singulated through the conductive via.

25 Claims, 18 Drawing Sheets

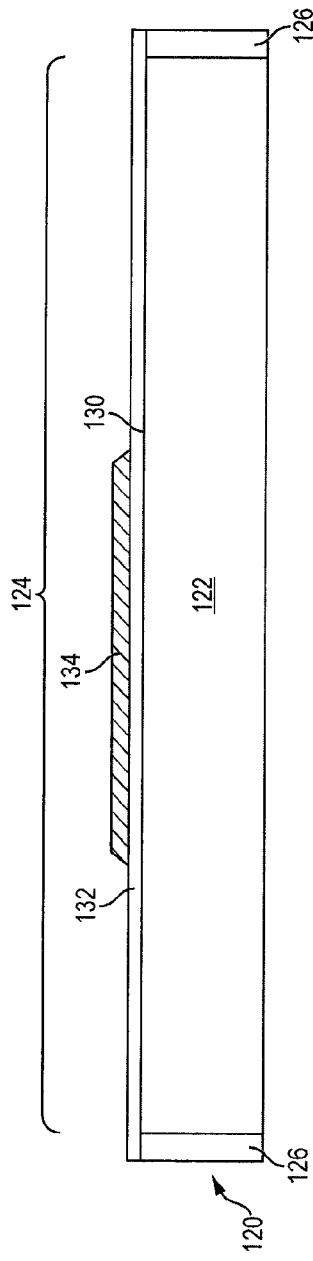
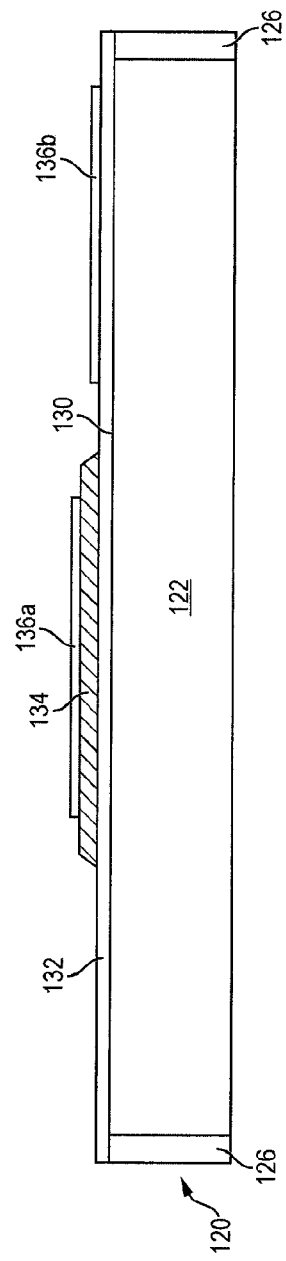
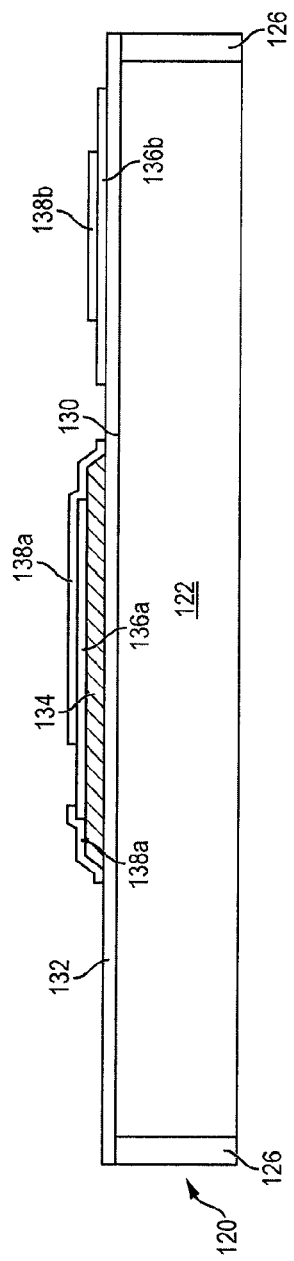

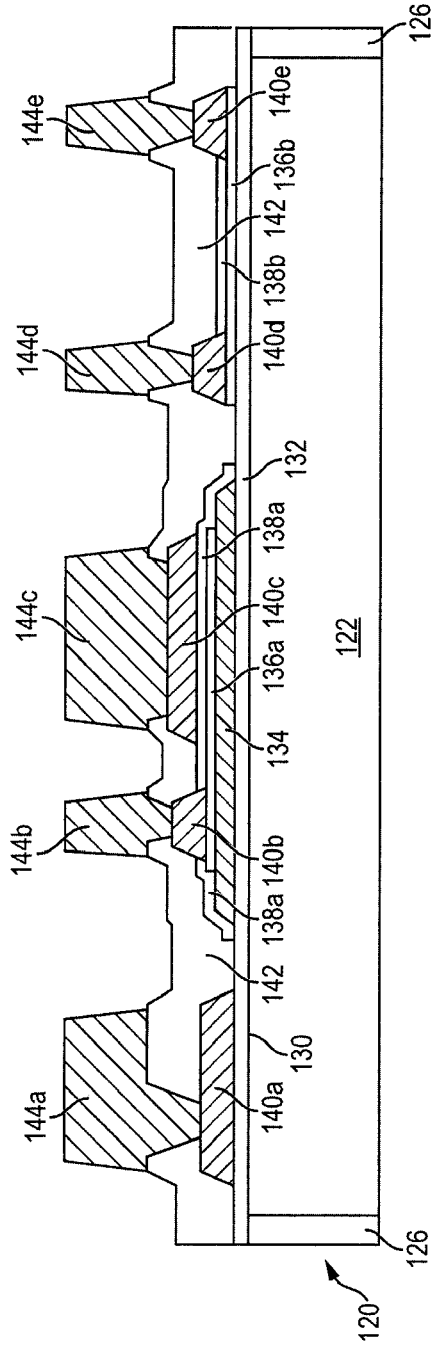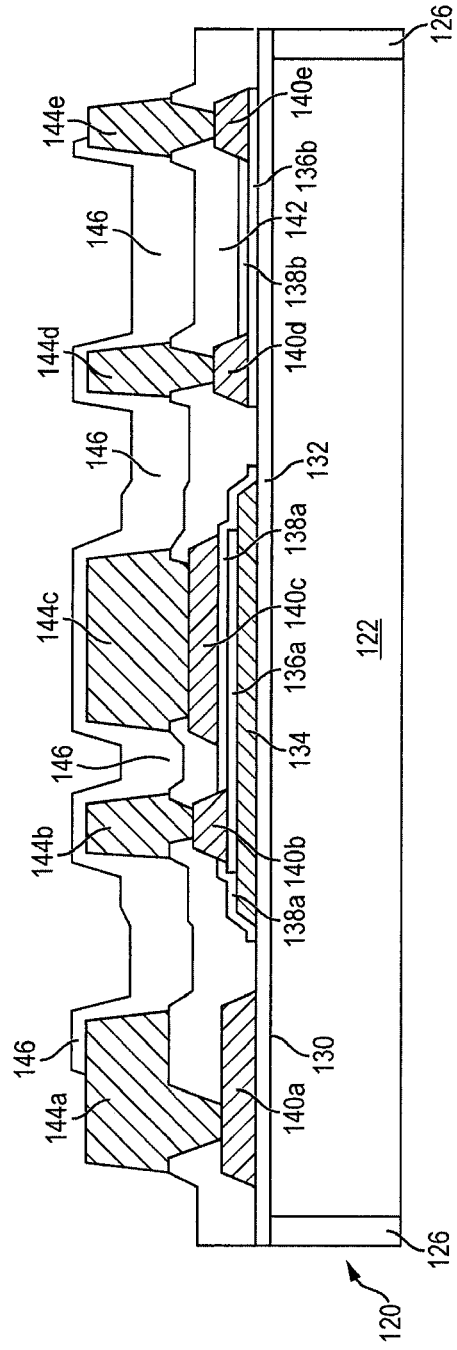
FIG. 3h
FIG. 3i

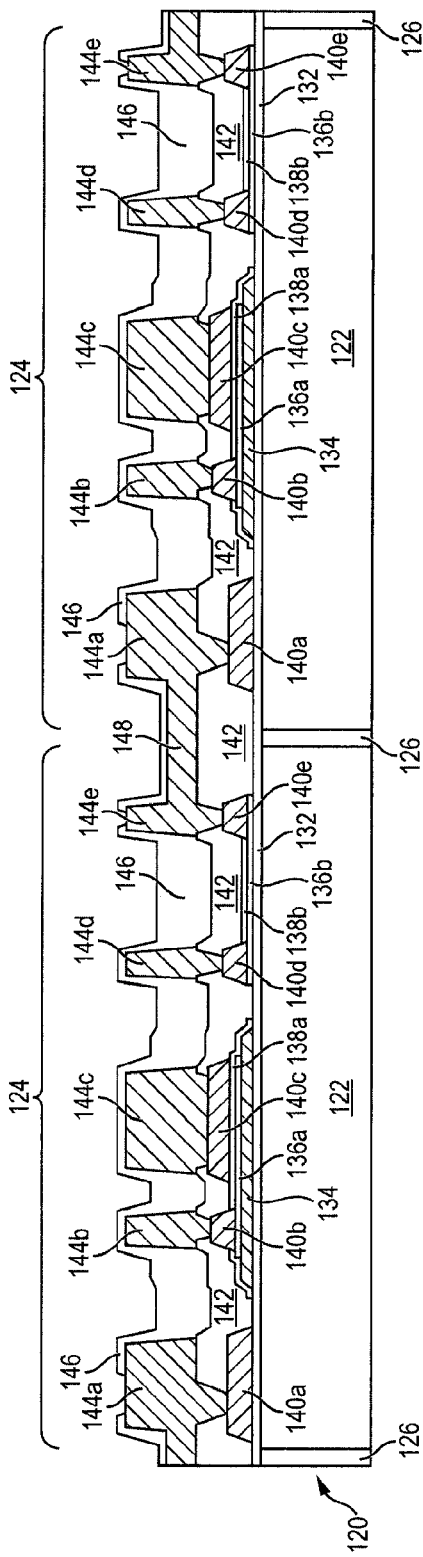
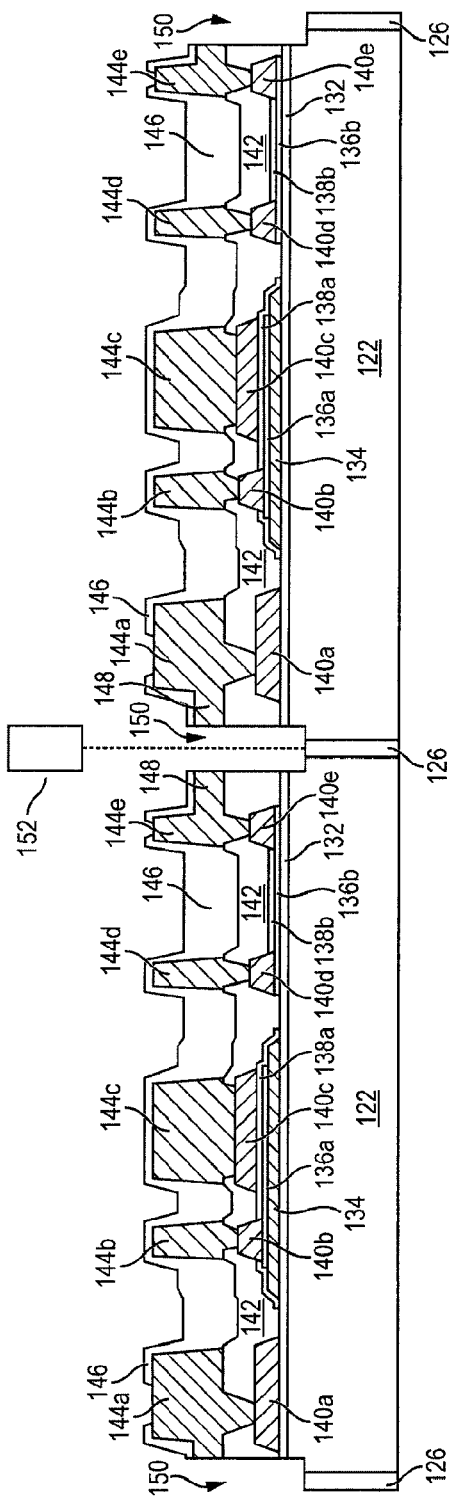
FIG. 3j
FIG. 3k

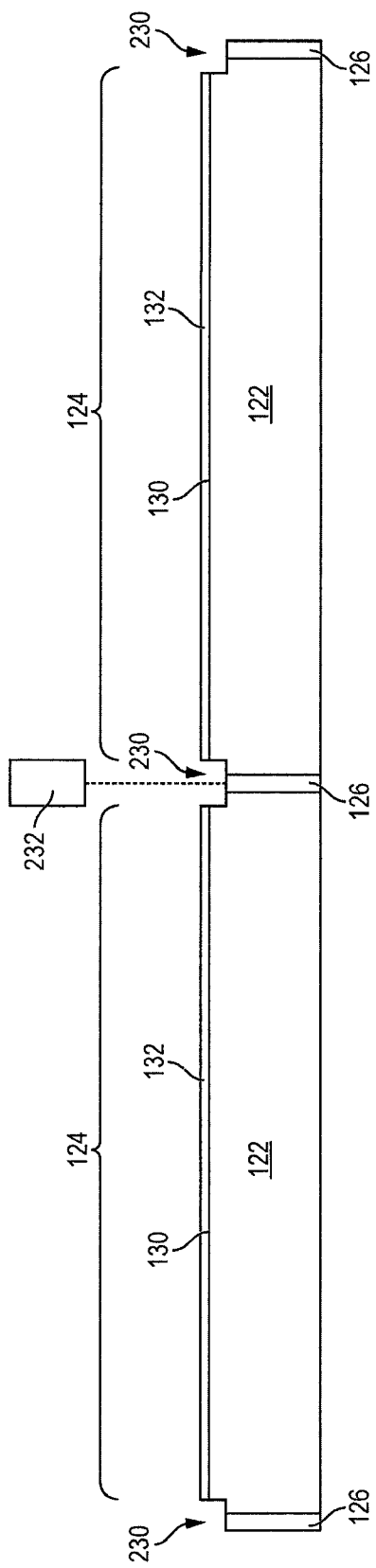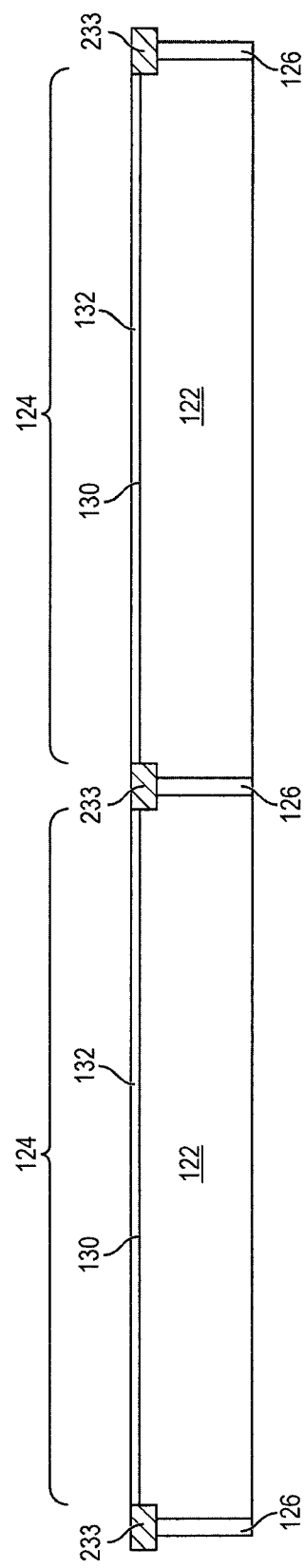

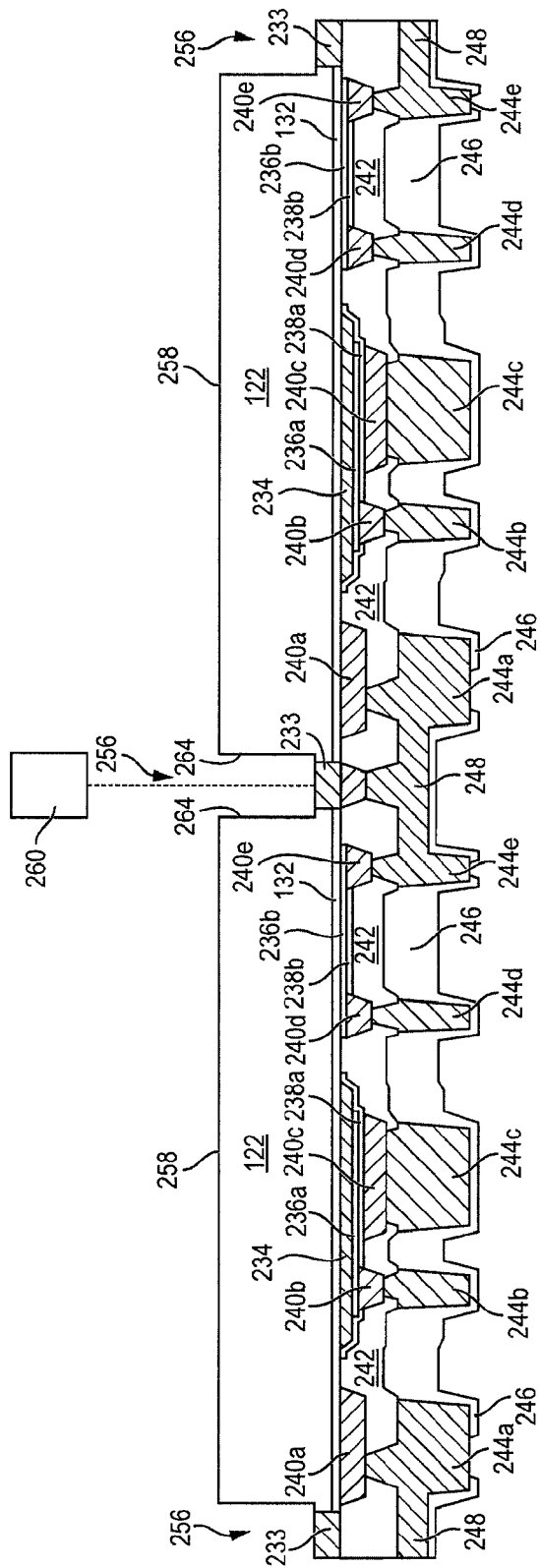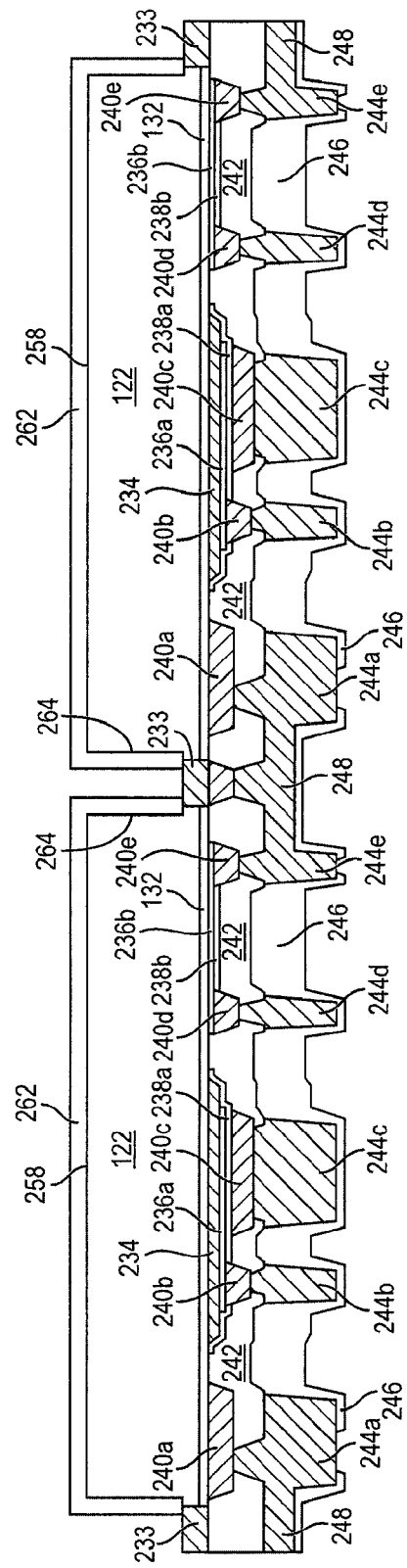

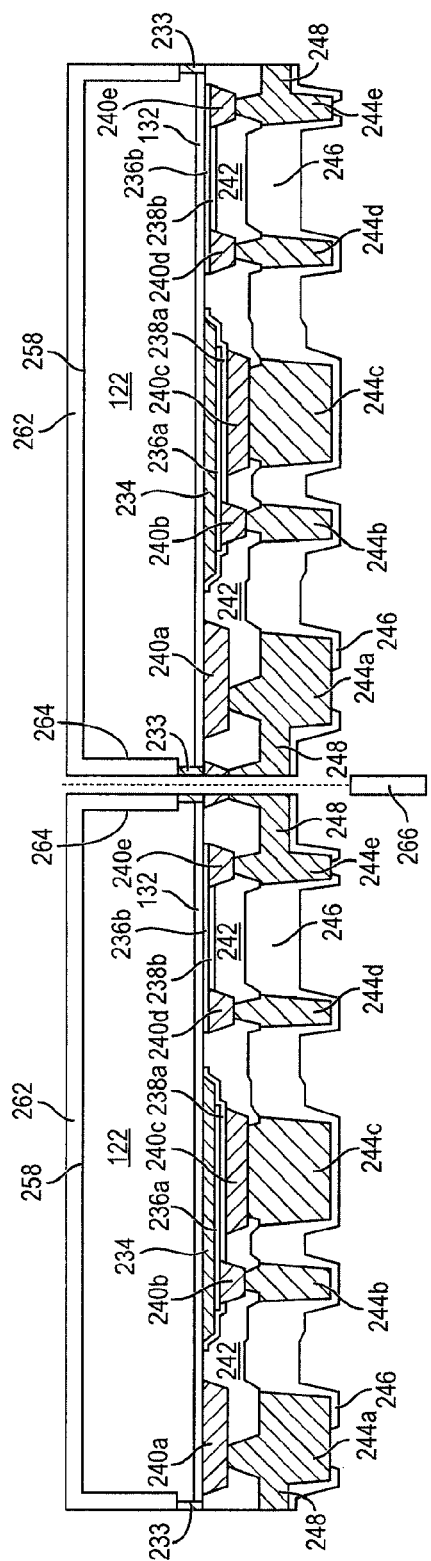
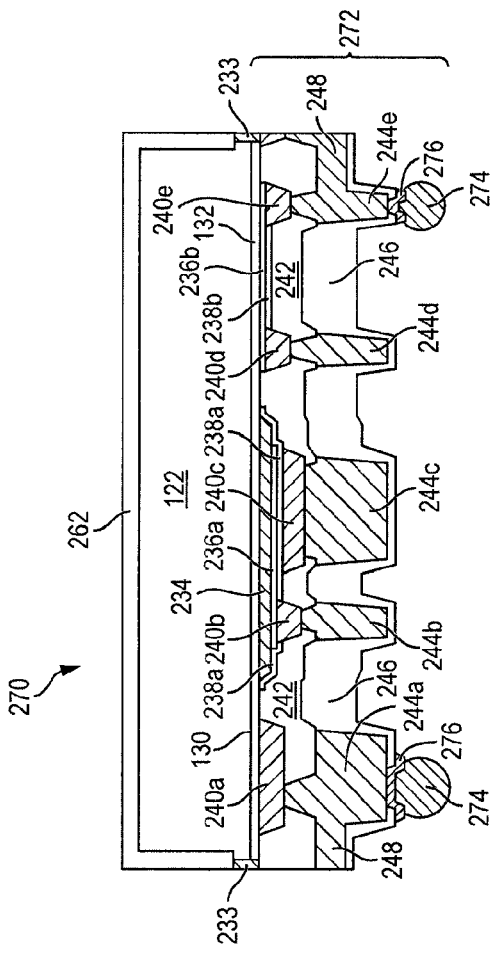
FIG. 7g
FIG. 8

SEMICONDUCTOR DEVICE AND METHOD OF FORMING SHIELDING LAYER AROUND BACK SURFACE AND SIDES OF SEMICONDUCTOR WAFER CONTAINING IPD STRUCTURE

CLAIM TO DOMESTIC PRIORITY

The present application is a division of U.S. patent application Ser. No. 12/816,190, now U.S. Pat. No. 8,183,130, filed Jun. 15, 2010, which is incorporated herein reference.

FIELD OF THE INVENTION

The present invention relates in general to semiconductor devices and, more particularly, to a semiconductor device and method of forming a shielding layer around a back surface and sides of a semiconductor wafer containing an IPD structure.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate or are susceptible to undesired electromagnetic interference (EMI) and radio frequency interference (RFI), harmonic distortion, or other inter-device interference, such as capacitive, inductive, or conductive coupling, also known as cross-talk, which can interfere with their operation.

In a system-in-package (SiP), an IPD structure can be formed over an active surface of a semiconductor die substrate. The SiP with an IPD structure is commonly used in portable electronics products such as cellular phone, PDA, DVC, or the devices requiring high-speed functions. Advanced functionality, high speed operation, miniaturization, and weight reduction are essential for these products to be accepted by the market. Accordingly, the distance between semiconductor devices must be decreased to achieve higher density. However, miniaturization and higher speed operation leads to inter-device interference. In addition, leakage currents between the active surface and IPD are a common problem. While it is known to form a shielding layer over the IPD structure, many known shielding layers are time consuming and costly to manufacture.

SUMMARY OF THE INVENTION

A need exists to reduce inter-device interference in a SiP with an IPD structure. Accordingly, in one embodiment, the present invention is a semiconductor device comprising a substrate and first insulating layer formed over a first surface of the substrate. An IPD structure is formed over the first insulating layer. A conductive via is formed through the IPD structure and partially through the substrate. A second via is formed through a second surface of the semiconductor wafer opposite the first surface of the substrate and extending to the conductive via. A shielding layer is formed over the second surface of the substrate and extending into the second via to the conductive via.

In another embodiment, the present invention is a semiconductor device comprising a substrate and IPD structure formed over a first surface of the substrate. A conductive via is formed through the IPD structure. A second via is formed through a second surface of the semiconductor wafer opposite the first surface of the substrate and extending to the conductive via. A shielding layer is formed over the second surface of the substrate and extending into the second via to the conductive via.

In another embodiment, the present invention is a semiconductor device comprising a substrate and conductive via formed partially through a first surface of the substrate. An IPD structure is formed over the first surface of the substrate. A second via is formed through a second surface of the semiconductor wafer opposite the first surface of the substrate and extending to the conductive via. A shielding layer is formed over the second surface of the substrate and extending into the second via to the conductive via.

In another embodiment, the present invention is a semiconductor device comprising a substrate and IPD structure formed over a first surface of the substrate. A via is formed through a second surface of the semiconductor wafer opposite the first surface of the substrate. A shielding layer is formed over the second surface of the substrate and extending into the via.

BRIEF DESCRIPTION OF THE DRAWINGS

FIGS. 7a-7g illustrate another process of forming a shielding layer around a back surface and sides of a semiconductor wafer containing an IPD structure; and FIG. 8 illustrates a semiconductor package with an IPD formed over the substrate and having a shielding layer formed around back surface and sides of the substrate.

DETAILED DESCRIPTION OF THE DRAWINGS

Figure 1:
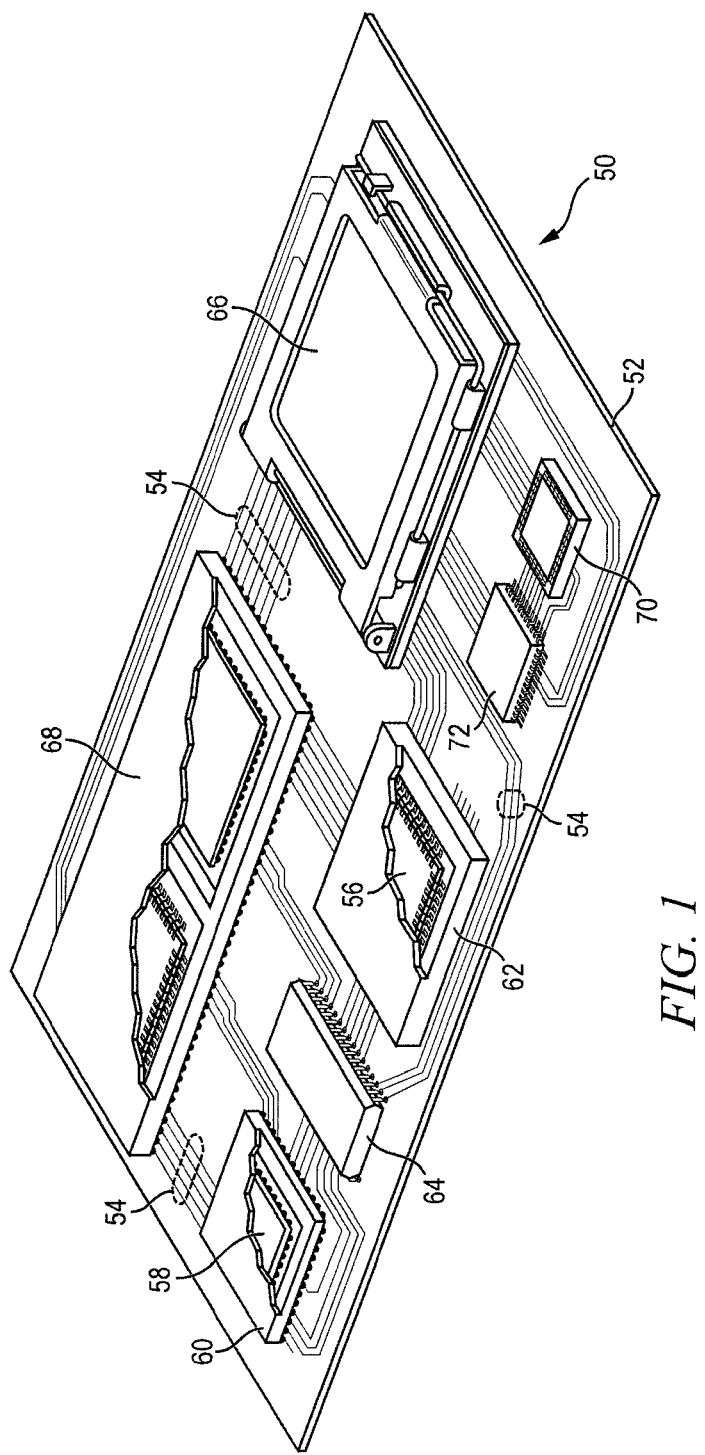
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
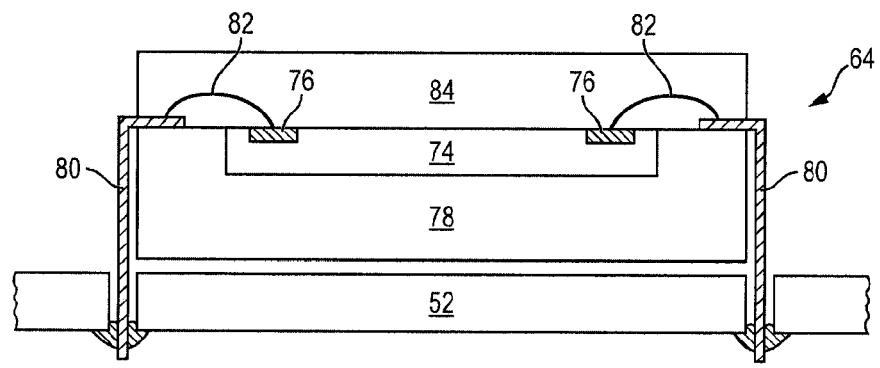
FIGS. 2a-2c illustrate further detail of the representative semiconductor packages mounted to the PCB.
Figure 2B:
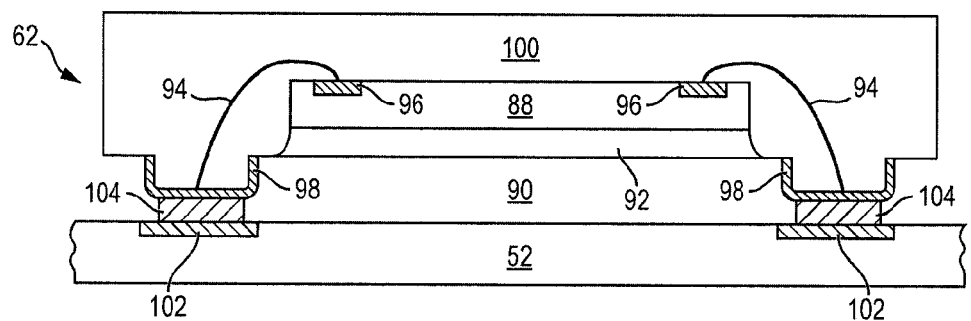
Figure 2C:
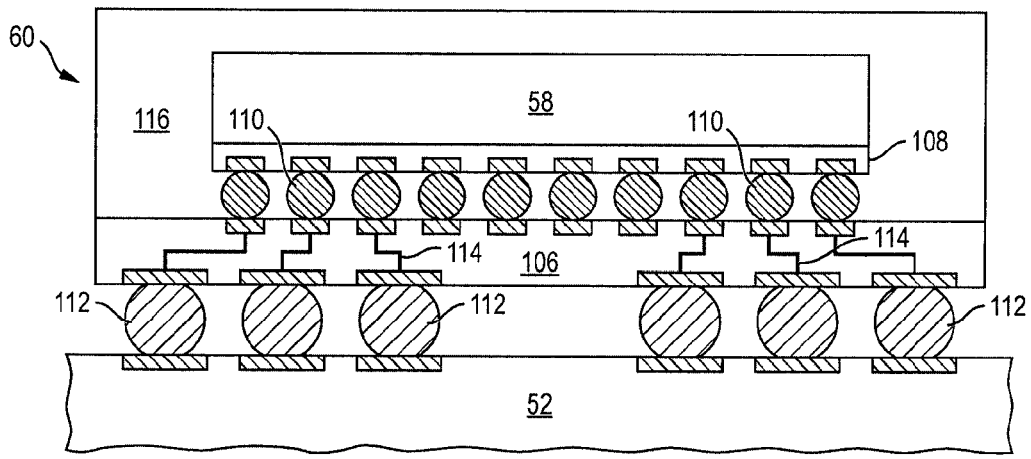

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
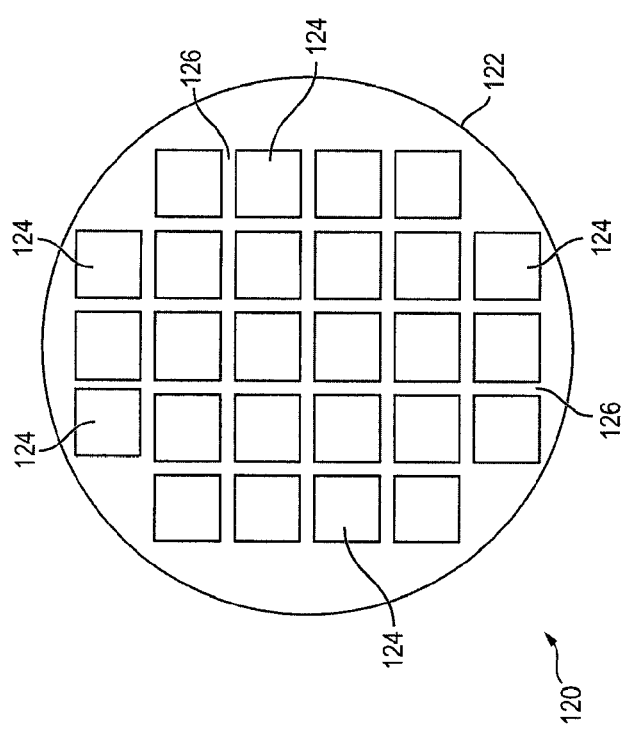
FIGS. 3a-3q illustrate a process of forming a shielding layer around a back surface and sides of a semiconductor wafer containing an IPD structure.
Figure 3B:
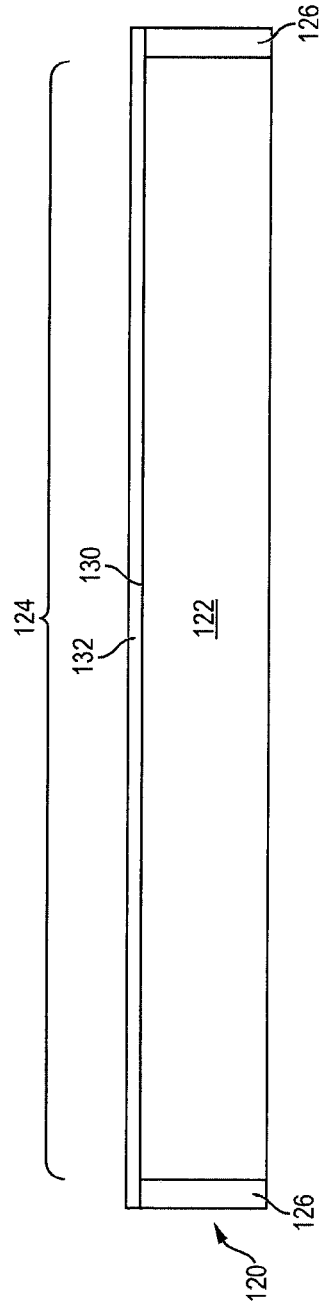
Figure 3F:
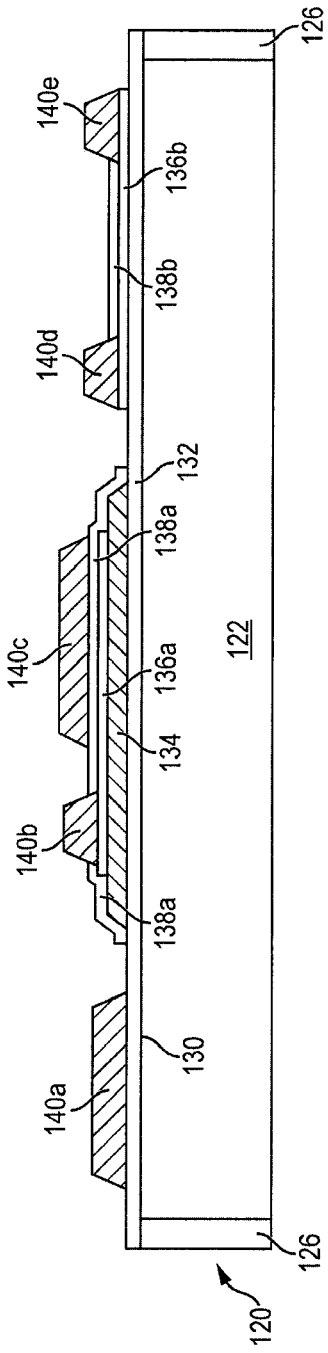
Figure 3G:
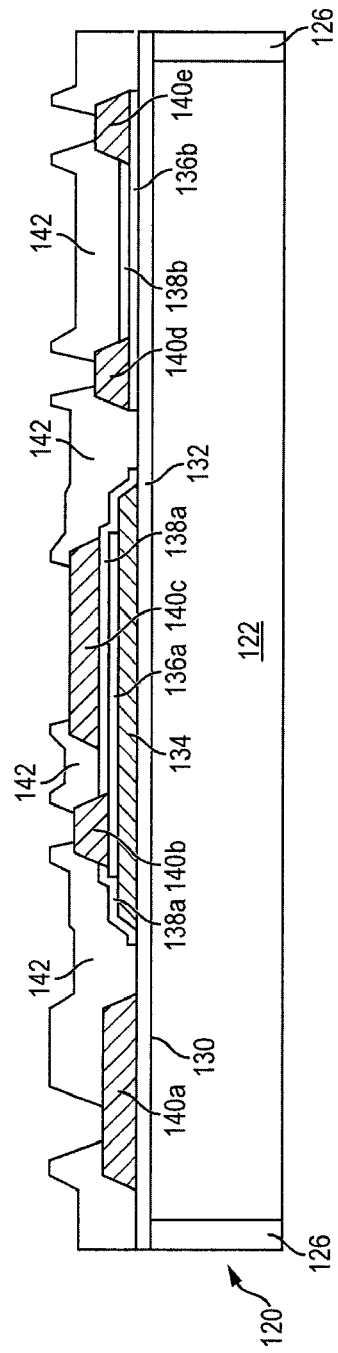
Figure 3L:
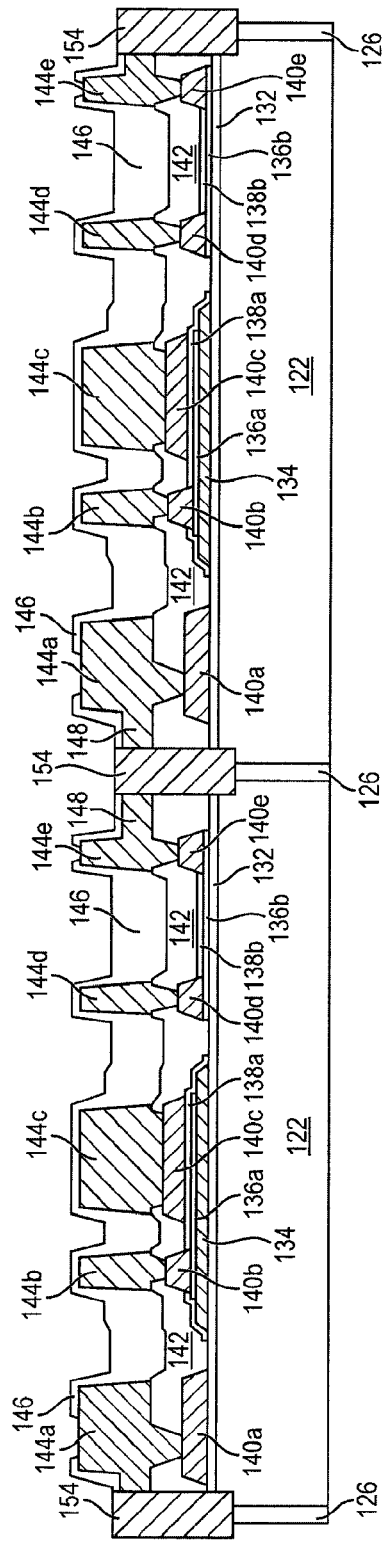
Figure 3M:
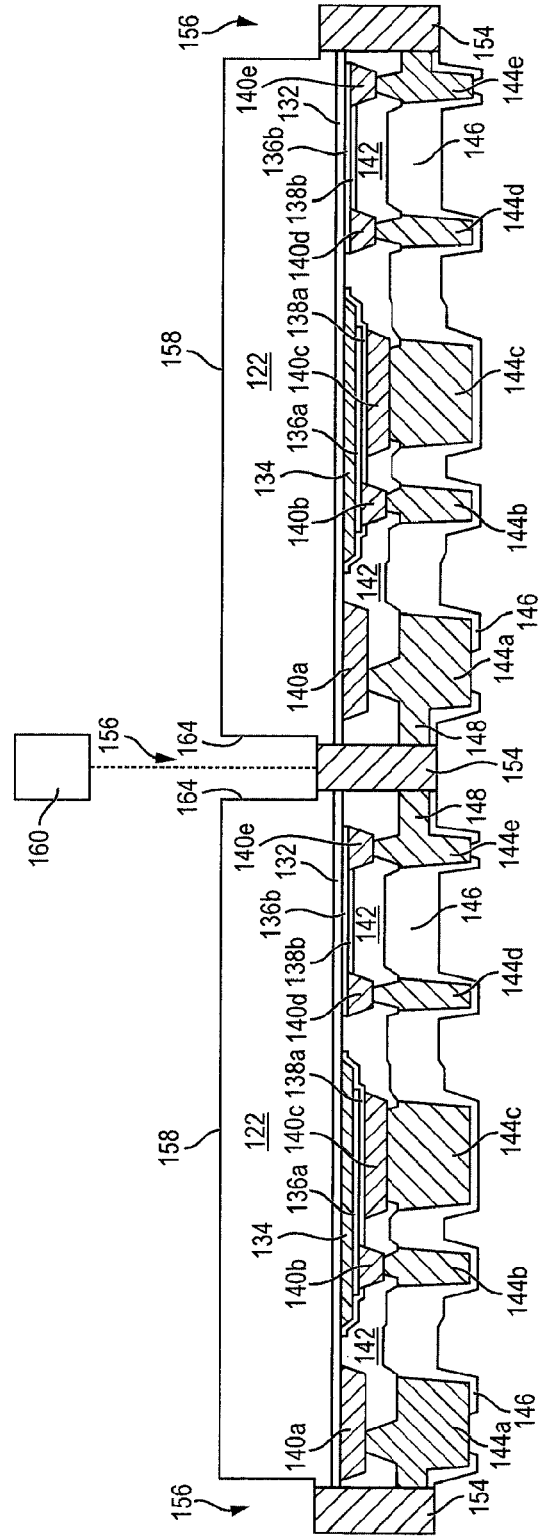
Figure 3N:
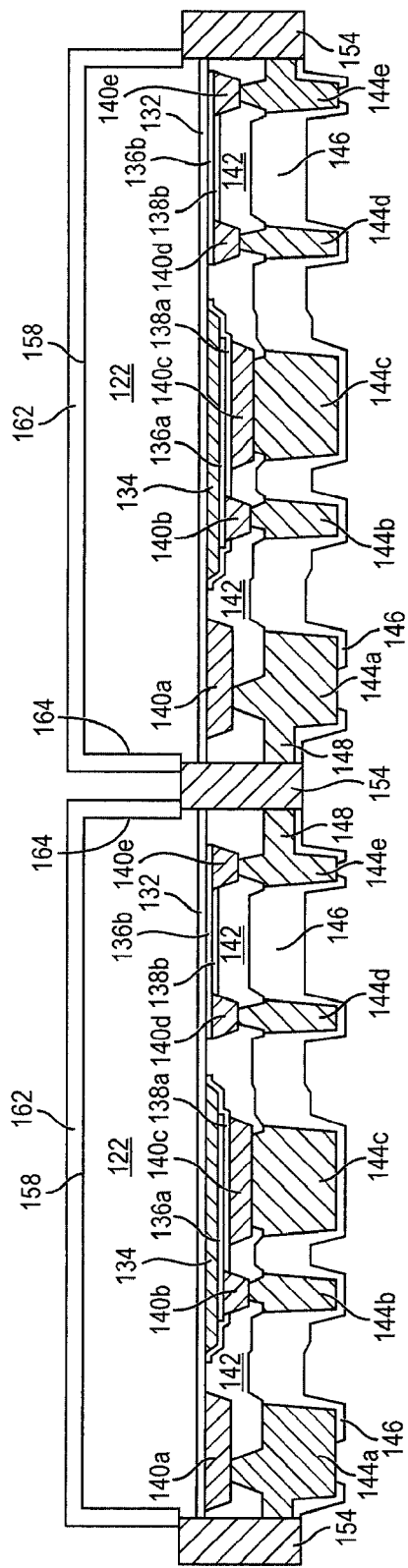
Figure 3Q:
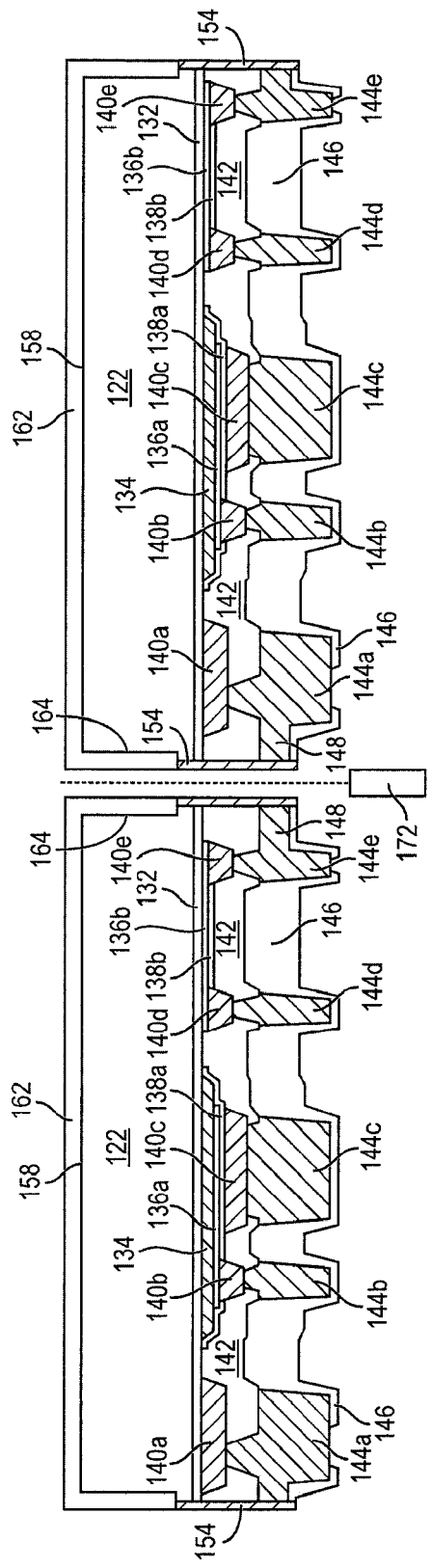

FIGS. 3a-3q illustrate, in relation to FIGS. 1 and 2a-2c, a process of forming a shielding layer around a back surface and sides of a semiconductor wafer containing an IPD structure. FIG. 3a shows a semiconductor wafer 120 with bulk substrate material 122, such as silicon, germanium, gallium arsenide, indium phosphide, or silicon carbide, for structural support. A plurality of semiconductor die or components 124 is formed on wafer 120 separated by saw streets 126 as described above. In one embodiment, substrate 122 has a thickness of about 250 micrometers (μm).

FIG. 3b shows a one-die cross-sectional view of a portion of semiconductor wafer 120. Each semiconductor die 124 has an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain IPDs, such as inductors, capacitors, and resistors, for RF signal processing.

An insulating or dielectric layer 132 is formed over active surface 130 with a thickness of about 0.1 μm to suppress surface conduction. The insulating layer 132 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 132 is formed using surface implantation, PVD, CVD, screen printing, spin coating, spray coating, sintering, or thermal oxidation. An optional grinding process can be used to planarize insulating layer 132 to create a flat surface for formation of an IPD structure.

FIGS. 3c-3l illustrate formation of the IPD structure. In FIG. 3c, an electrically conductive layer 134 is formed over insulating layer 132 using a patterning and metal deposition process such as sputtering, electrolytic plating, and electroless plating. Conductive layer 134 can be one or more layers of Al, Cu, Sn, Ni, Au, Ag, or other suitable electrically conductive material. Conductive layer 134 operates as a method capacitor (M-cap) base layer, i.e., a bottom electrode of subsequently formed capacitors.

In FIG. 3d, a resistive layer 136 is patterned and deposited over conductive layer 134 and insulating layer 132. More specifically, resistive layer 136a is formed over conductive layer 134, and resistive layer 136b is formed over insulating layer 132. Resistive layer 136 can be tantalum silicide (TaSi2) or other metal silicides, TaN, nichrome (NiCr), TiN, or doped poly-silicon. The deposition of resistive layer 136 may involve PVD or CVD with thicknesses matching designed surface resistivity (Rs).

In FIG. 3e, an insulating or dielectric layer 138 is formed over resistive layer 136, M-CAP 134, and insulating layer 132. More specifically, insulating layer 138a is formed over resistive layer 136a, M-CAP 134, and insulating layer 132, and insulating layer 138b is formed over resistive layer 136b. The insulating layer 138 contains one or more layers of SiO2, Si3N4, SiON, Ta2O5, Al2O3, polyimide, benzocyclobutene (BCB), polybenzoxazoles (PBO), or other suitable dielectric material. The insulating layer 138 is formed using PVD, CVD, screen printing, spin coating, spray coating, sintering, or thermal oxidation.

In FIG. 3f, an electrically conductive layer 140 is formed over insulating layer 132, resistive layer 136, and insulating layer 138 using a patterning and metal deposition process such as sputtering, electrolytic plating, and electroless plating. More specifically, conductive layer 140a is formed over insulating layer 132; conductive layer 140b is formed over resistive layer 136a; conductive layer 140c is formed over insulating layer 138a; and conductive layer 140d and 140e are formed over resistive layer 136b. Conductive layer 140 can be one or more layers of Al, Cu, Sn, Ni, Au, Ag, or other suitable electrically conductive material.

In FIG. 3g, an insulating or passivation layer 142 is formed over insulating layer 132, conductive layer 140, and insulating layer 138. The insulating layer 142 contains one or more layers of SiO2, Si3N4, SiON, Ta2O5, Al2O3, or other suitable material having similar insulating and structural properties. The insulating layer 142 is formed using PVD, CVD, screen printing, spin coating, spray coating, sintering, or thermal oxidation. A portion of insulating layer 142 is removed by an etching process to expose conductive layer 140a-140e.

In FIG. 3h, an electrically conductive layer 144 is formed over insulating layer 142 and the exposed conductive layer 140 using a patterning and metal deposition process such as sputtering, electrolytic plating, and electroless plating. More specifically, conductive layer 144a-144e is formed over conductive layer 140a-140e, respectively. Conductive layer 144 can be one or more layers of Al, Cu, Sn, Ni, Au, Ag, or other suitable electrically conductive material. In one embodiment, conductive layer 144 has a height of 8 μm.

In FIG. 3i, an insulating or passivation layer 146 is formed over insulating layer 142 and conductive layer 144. The insulating layer 146 contains one or more layers of SiO2, Si3N4, SiON, Ta2O5, Al2O3, or other suitable material having similar insulating and structural properties. The insulating layer 146 is formed using PVD, CVD, screen printing, spin coating, spray coating, sintering, or thermal oxidation. A portion of insulating layer 146 is removed by an etching process to expose conductive layer 144a and 144e.

FIG. 3j shows a two-die cross-sectional view of semiconductor wafer 120. An electrically conductive layer 148 is formed between conductive layers 144 using a patterning and metal deposition process such as sputtering, electrolytic plating, and electroless plating. More specifically, conductive layer 148 is formed between conductive layer 144a and 144e of adjacent semiconductor die 124. Conductive layer 148 can be one or more layers of Al, Cu, Sn, Ni, Au, Ag, or other suitable electrically conductive material.

In FIG. 3k, a plurality of vias 150 is formed through a portion of the IPD structure, i.e., conductive layer 148 and insulating layers 142 and 146, using saw blade or laser cutting tool 152. Vias 150 extend through insulating layer 132 and below active surface 130, partially into but not completely through saw street 126 and bulk substrate material 122. Vias 150 extend around a periphery of each semiconductor die 124 on wafer 120. In one embodiment, vias 150 have a width of 70-90 micrometers (μm) and extend to a depth of 50-150 μm below active surface 130.

In FIG. 3l, vias 150 are filled with Al, Cu, Sn, Ni, Au, Ag, Ti, tungsten (W), poly-silicon, or other suitable electrically conductive material using electrolytic plating, electroless plating process, or other suitable metal deposition process to form z-direction conductive vias 154.

In FIG. 3m, the structure is inverted and a plurality of vias 156 is formed from back surface 158 of semiconductor die 120 through saw street 126 and bulk substrate material 122 using saw blade or laser cutting tool 160. Vias 156 extend partially into saw street 126 and bulk substrate material 122 to conductive vias 154. Vias 156 extend around a periphery of each semiconductor die 124 on wafer 120. Vias 156 are wider than vias 150. In one embodiment, vias 156 have a width of 90-110 μm and extend to a depth of 130-230 μm below back surface 158.

In FIG. 3n, a shielding layer 162 is formed over back surface 158 of semiconductor wafer 120. Shielding layer 162 extends into vias 156, along sidewall 164 of vias 156, down to conductive vias 154. Shielding layer 162 extends around a periphery of semiconductor die 124. Shielding layer 162 can be Al, ferrite or carbonyl iron, stainless steel, nickel silver, low-carbon steel, silicon-iron steel, foil, conductive resin, and other metals and composites capable of blocking or absorbing EMI, RFI, harmonic distortion, and other inter-device interference. Shielding layer 162 is patterned and conformally deposited using an electrolytic plating, electroless plating, sputtering, PVD, CVD, or other suitable metal deposition process. Shielding layer 162 can also be a non-metal material such as carbon-black or aluminum flake to reduce the effects of EMI and RFI. For non-metal materials, shielding layer 162 can be applied by lamination, spraying, or painting. Shielding layer 162 is electrically connected through conductive vias 154 and conductive layers 144a and 144e and 148 to an external low-impedance ground point.

Figure 3O:
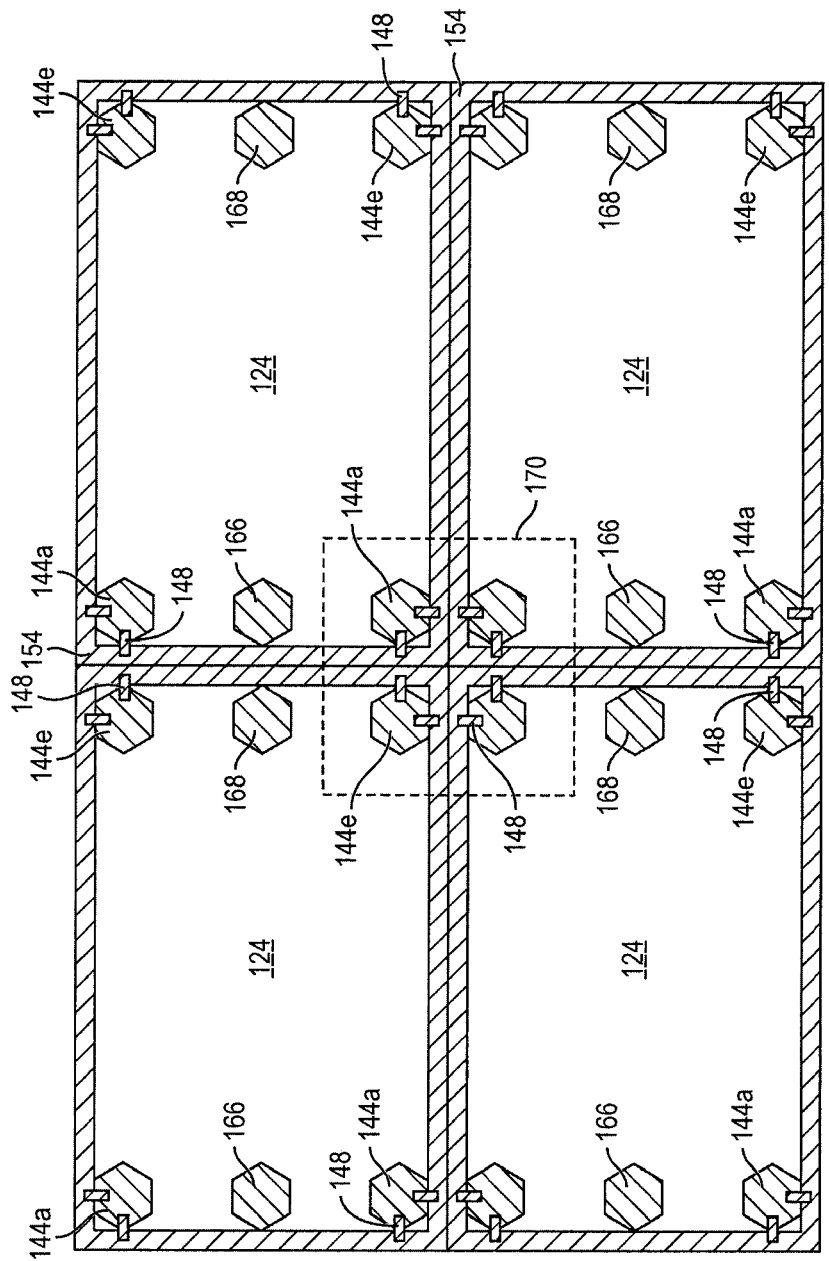

FIG. 3o shows a four-die bottom view of conductive vias 154 electrically connected to conductive layers 144a and 144e and 148. The ground pad for conductive layer 144a and 144e is shown enlarged around the edge of each semiconductor die 124. Contact pad 166 receives an input signal to semiconductor die 124 and is electrically connected, for example, to conductive layer 144b. Contact pad 168 provides an output signal from semiconductor die 124 and is electrically connected, for example, to conductive layer 144d.

Figure 3P:
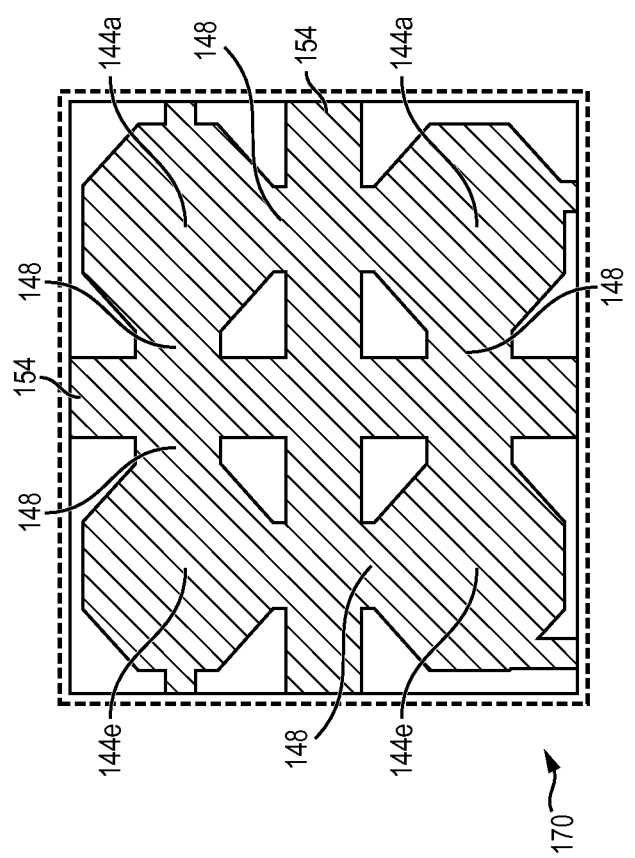

FIG. 3p shows further detail of area 170 in FIG. 3o. Conductive vias 154 are electrically connected to conductive layers 144a and 144e.

In FIG. 3q, semiconductor wafer 120 is singulated through conductive vias 154 using saw blade or laser cutting tool 172 to separate individual semiconductor die 124.

Figure 4:
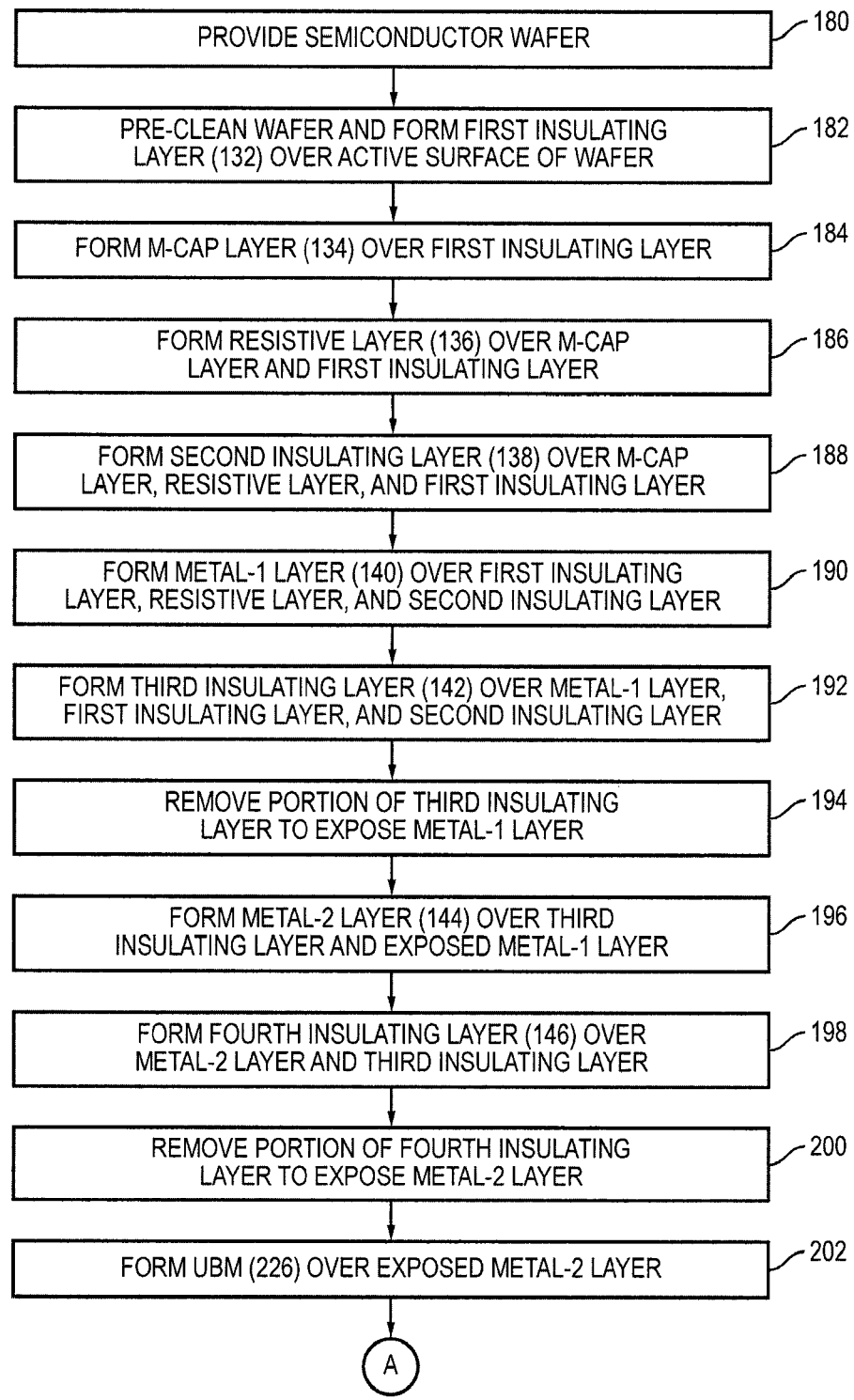
FIG. 4 illustrates a flowchart of forming the shielding layer around the back surface and sides of the semiconductor wafer containing the IPD structure.
Figure 4:
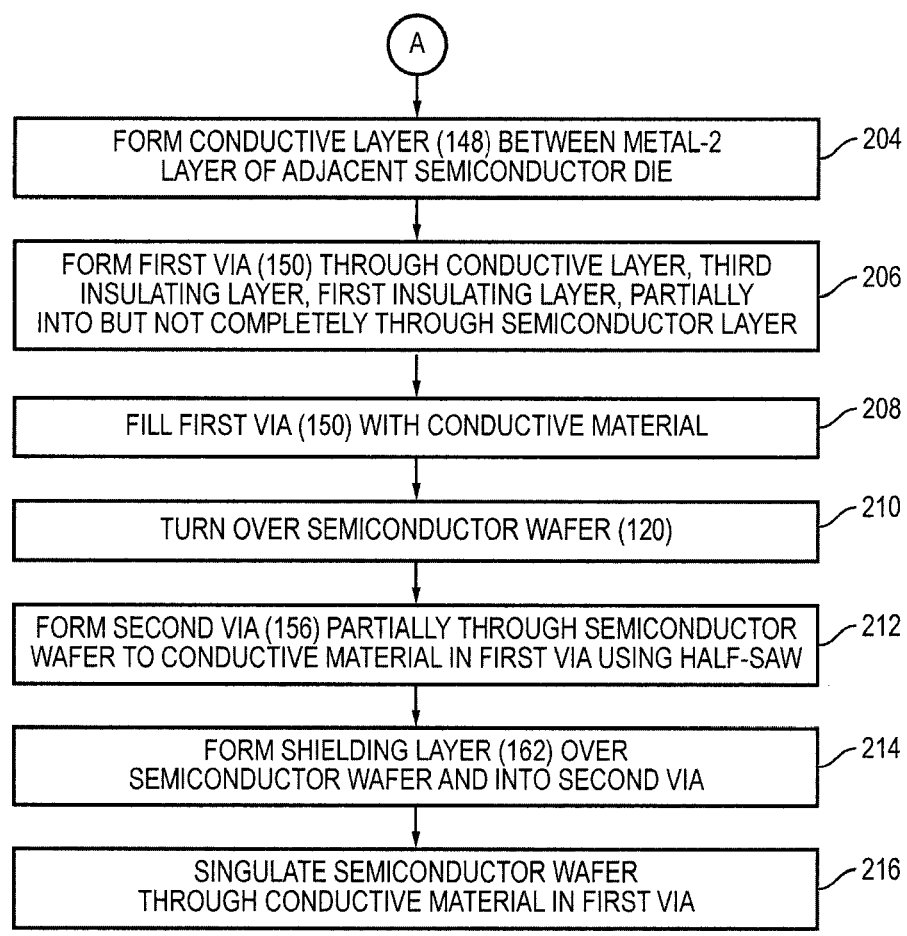

FIG. 4 shows a flowchart of the process described in FIGS. 3a-3q. In step 180, a semiconductor wafer 120 is provided. In step 182, the wafer is pre-cleaned and a first insulating layer 132 is formed over the active surface of the wafer. In step 184, an M-CAP layer 134 is formed over the first insulating layer. In step 186, a resistive layer 136 is formed over the M-CAP layer and first insulating layer. In step 188, a second insulating layer 138 is formed over the M-CAP layer, resistive layer, and first insulating layer. In step 190, a metal-1 layer 140 is formed over the first insulating layer, resistive layer, and second insulating layer. In step 192, a third insulating layer 142 is formed over the metal-1 layer, first insulating layer, and second insulating layer. In step 194, a portion of the third insulating layer is removed to expose the metal-1 layer. In step 196, a metal-2 layer 144 is formed over the third insulating layer and exposed metal-1 layer. In step 198, a fourth insulating layer 146 is formed over the metal-2 layer and third insulating layer. In step 200, a portion of the fourth insulating layer is removed to expose metal-2 layer. In step 202, a UBM 226 is formed over the exposed metal-2 layer. In step 204, a conductive layer 148 is formed between metal-2 layer of the adjacent semiconductor die. In step 206, a first via 150 is formed through the conductive layer, third insulating layer, first insulating layer, and partially into but not completely through the semiconductor wafer. In step 208, the first via 150 is filled with conductive material. In step 210, the semiconductor wafer is turned over. In step 212, a second via 156 is formed partially through semiconductor wafer to the conductive material in the first via using half-saw. In step 214, a shielding layer 162 is formed over the semiconductor wafer and into the second via. In step 216, the semiconductor wafer is singulated through the conductive material in the first via.

Figure 5:
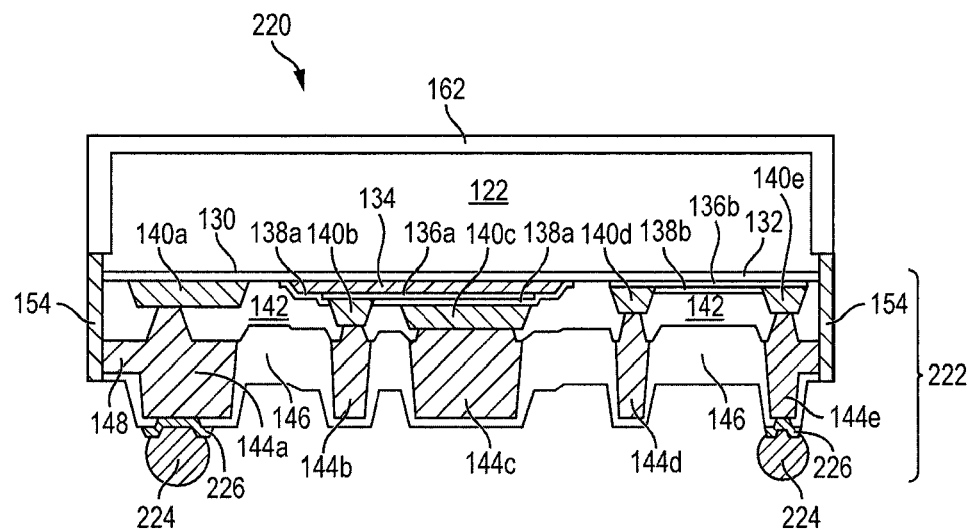
FIG. 5 illustrates a semiconductor package with an IPD formed over the substrate and having a shielding layer formed around back surface and sides of the substrate.

FIG. 5 shows system-in-package (SiP) 220 after singulation. Conductive layers 134, 140, and 144, as well as resistive layer 136 and insulating layers 138, 142, and 146, constitute one or more passive circuit elements in an IPD structure 222 formed over semiconductor die 124 for RF signal processing. In particular, conductive layer 134, resistive layer 136a, insulating layer 138a, conductive layer 140c, and conductive layer 144c constitute a metal-insulator-metal (MiM) capacitor. Resistive layer 136b provides a resistive element. The individual sections of conductive layer 144 can be wound or coiled in plan-view to produce or exhibit inductive properties. For example, conductive layer 144b, 144d, and 144e constitute a wound or spiral inductor. The IPD structure 222 is isolated by grounding conductive layer 144a and 144e.

An electrically conductive bump material is deposited over the exposed conductive layer 144a and 144e using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 144 using a suitable attachment or bonding process. In one embodiment, the bump material is reflowed by heating the material above its melting point to form spherical balls or bumps 224. In some applications, bumps 224 are reflowed a second time to improve electrical contact to conductive layer 144. An under bump metallization (UBM) 226 can be formed under bumps 224. The bumps can also be compression bonded to conductive layer 144. Bumps 224 represent one type of interconnect structure that can be formed over conductive layer 144. The interconnect structure can also use bond wires, stud bump, micro bump, or other electrical interconnect.

Shielding layer 162 is formed at the wafer level and covers a top portion and side portions of bulk substrate material 122, around a periphery of semiconductor die 124. Shielding layer 162 is electrically connected through conductive vias 154, conductive layers 144a and 144e and 148, and bumps 224 to an external low-impedance ground point. Shielding layer 162 provides isolation of EMI, RFI, harmonic distortion, and other inter-device interference between SiP 220 and other semiconductor die or components. No separate ground shield cap is required, which reduces manufacturing costs.

Figure 6:
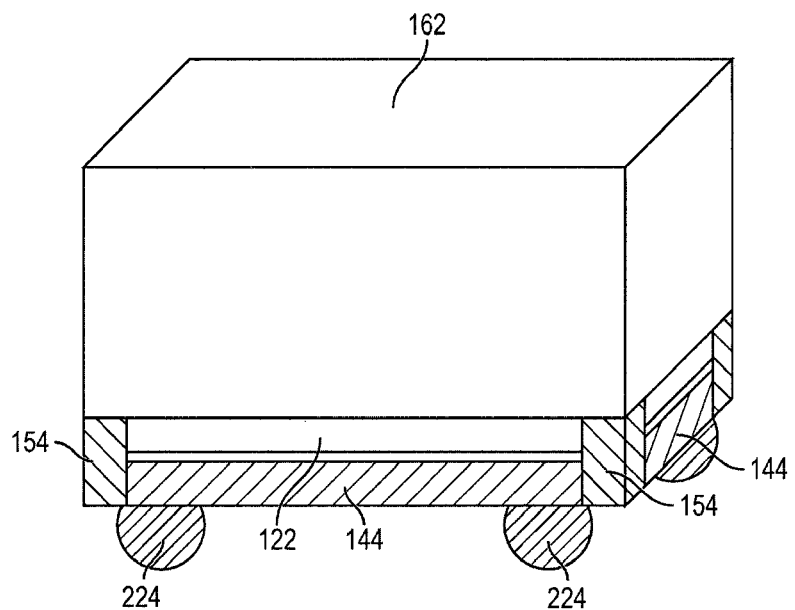
FIG. 6 illustrates a perspective view of the semiconductor package with the shielding layer formed over the substrate.

FIG. 6 shows a perspective view of SiP 220 after singulation. Shielding layer 162 cover a top portion and side portions of bulk substrate material 122, around a periphery of semiconductor die 124. Shielding layer 162 is electrically connected through conductive vias 154, conductive layers 144a and 144e and 148, and bumps 224 to an external low-impedance ground point. Conductive layer 144 forms a ground ring around SiP 220.

In another embodiment, continuing from FIG. 3b, FIG. 7a shows a two-die cross-sectional view of a portion of semiconductor wafer 120. A plurality of vias 230 is formed through insulating layer 132 and bulk substrate material 122 using saw blade or laser cutting tool 232. Vias 230 extend below active surface 130, partially into but not completely through saw street 126 and bulk substrate material 122. Vias 230 extend around a periphery of each semiconductor die 124 on wafer 120. In one embodiment, vias 230 have a width of 70-90 μm and extend to a depth of 30-100 μm below active surface 130.

In FIG. 7b, vias 230 are filled with Al, Cu, Sn, Ni, Au, Ag, Ti, W, poly-silicon, or other suitable electrically conductive material using electrolytic plating, electroless plating process, or other suitable metal deposition process to form z-direction conductive vias 233.

Figure 7C:
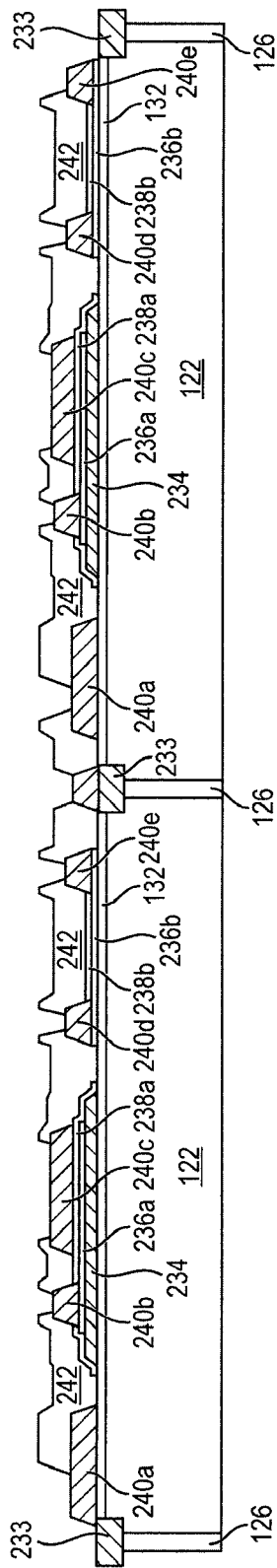
Figure 7D:
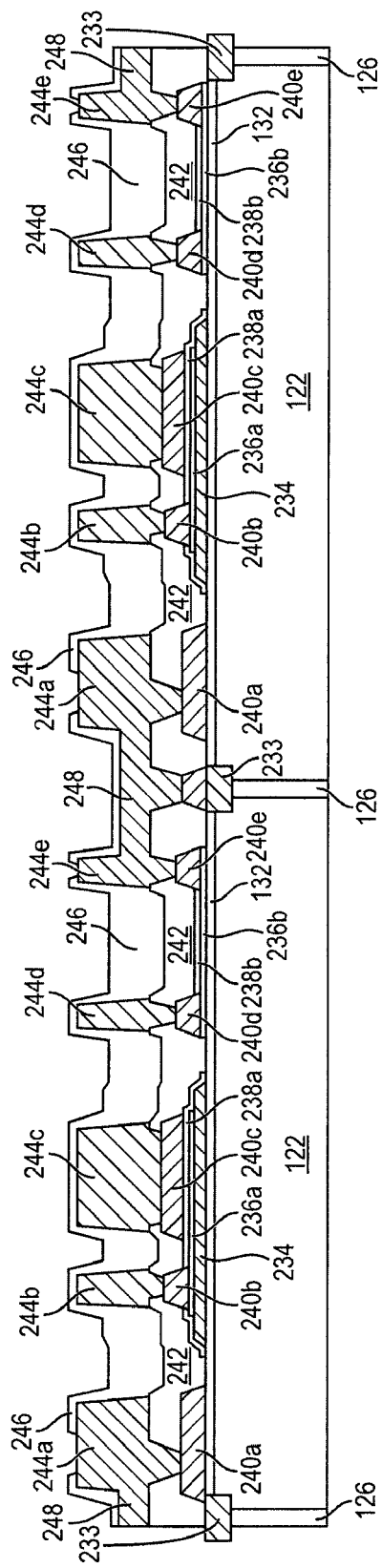

FIGS. 7c-7d illustrate formation of an IPD structure. In FIG. 7c, an electrically conductive layer 234 is formed over insulating layer 132 using a patterning and metal deposition process such as sputtering, electrolytic plating, and electroless plating. Conductive layer 234 can be one or more layers of Al, Cu, Sn, Ni, Au, Ag, or other suitable electrically conductive material. Conductive layer 234 operates as an M-cap base layer, i.e., a bottom electrode of subsequently formed capacitors.

A resistive layer 236 is patterned and deposited over conductive layer 234 and insulating layer 132. More specifically, resistive layer 236a is formed over conductive layer 234, and resistive layer 236b is formed over insulating layer 132. Resistive layer 236 can be TaSi2 or other metal silicides, TaN, NiCr, TiN, or doped poly-silicon. The deposition of resistive layer 236 may involve PVD or CVD with thicknesses matching designed surface resistivity Rs.

An insulating or dielectric layer 238 is formed over resistive layer 236, M-CAP 234, and insulating layer 132. More specifically, insulating layer 238a is formed over resistive layer 236a, M-CAP 234, and insulating layer 132, and insulating layer 238b is formed over resistive layer 236b. The insulating layer 238 contains one or more layers of SiO2, Si3N4, SiON, Ta2O5, Al2O3, polyimide, BCB, PBO, or other suitable dielectric material. The insulating layer 238 is formed using PVD, CVD, screen printing, spin coating, spray coating, sintering, or thermal oxidation.

An electrically conductive layer 240 is formed over insulating layer 132, resistive layer 236, and insulating layer 238 using a patterning and metal deposition process such as sputtering, electrolytic plating, and electroless plating. More specifically, conductive layer 240a is formed over insulating layer 132; conductive layer 240b is formed over resistive layer 236a; conductive layer 240c is formed over insulating layer 238a; and conductive layer 240d and 240e are formed over resistive layer 236b. Conductive layer 240 can be one or more layers of Al, Cu, Sn, Ni, Au, Ag, or other suitable electrically conductive material.

An insulating or passivation layer 242 is formed over insulating layer 132, conductive layer 240, and insulating layer 238. The insulating layer 242 contains one or more layers of SiO2, Si3N4, SiON, Ta2O5, Al2O3, or other suitable material having similar insulating and structural properties. The insulating layer 242 is formed using PVD, CVD, screen printing, spin coating, spray coating, sintering, or thermal oxidation. A portion of insulating layer 242 is removed by an etching process to expose conductive layer 240a-240e.

In FIG. 7d, an electrically conductive layer 244 is formed over insulating layer 242 and the exposed conductive layer 240 using a patterning and metal deposition process such as sputtering, electrolytic plating, and electroless plating. More specifically, conductive layer 244a-244e is formed over conductive layer 240a-240e, respectively. Conductive layer 244 can be one or more layers of Al, Cu, Sn, Ni, Au, Ag, or other suitable electrically conductive material.

An insulating or passivation layer 246 is formed over insulating layer 132 and conductive layer 244. The insulating layer 246 contains one or more layers of SiO2, Si3N4, SiON, Ta2O5, Al2O3, or other suitable material having similar insulating and structural properties. The insulating layer 246 is formed using PVD, CVD, screen printing, spin coating, spray coating, sintering, or thermal oxidation.

An electrically conductive layer 248 is formed between conductive layers 244 using a patterning and metal deposition process such as sputtering, electrolytic plating, and electroless plating. More specifically, conductive layer 248 is formed between conductive layer 244e of the left semiconductor die 124 and conductive layer 244a of the right semiconductor die 124a. Conductive layer 248 can be one or more layers of Al, Cu, Sn, Ni, Au, Ag, or other suitable electrically conductive material.

In FIG. 7e, the structure is inverted and a plurality of vias 256 is formed from back surface 258 of semiconductor die 120 through saw street 126 and bulk substrate material 122 using saw blade or laser cutting tool 260. Vias 256 extend partially into saw street 126 and bulk substrate material 122 to conductive vias 233. Vias 256 extend around a periphery of each semiconductor die 124 on wafer 120. Vias 256 are wider than vias 250. In one embodiment, vias 256 have a width of 90-100 µm and extend to a depth of 130-230 µm below back surface 258.

In FIG. 7f, a shielding layer 262 is formed over back surface 258 of semiconductor wafer 120. Shielding layer 262 extends into vias 256, along sidewall 264 of vias 256, down to conductive vias 233. Shielding layer 262 extends around a periphery of semiconductor die 124. Shielding layer 262 can be Al, ferrite or carbonyl iron, stainless steel, nickel silver, low-carbon steel, silicon-iron steel, foil, conductive resin, and other metals and composites capable of blocking or absorbing EMI, RFI, harmonic distortion, and other inter-device interference. Shielding layer 262 is patterned and conformally deposited using an electrolytic plating, electroless plating, sputtering, PVD, CVD, or other suitable metal deposition process. Shielding layer 262 can also be a non-metal material such as carbon-black or aluminum flake to reduce the effects of EMI and RFI. For non-metal materials, shielding layer 262 can be applied by lamination, spraying, or painting. Shielding layer 262 is electrically connected through conductive vias 233 and conductive layers 244a and 244e and 248 to an external low-impedance ground point.

In FIG. 7g, semiconductor wafer 120 is singulated through conductive vias 233 using saw blade or laser cutting tool 266 to separate individual semiconductor die 124.

FIG. 8 shows SiP 270 after singulation. Conductive layers 234, 240, and 244, as well as resistive layer 236 and insulating layers 238, 242, and 246, constitute one or more passive circuit elements in an IPD structure 272 formed over semiconductor die 124 for RF signal processing. In particular, conductive layer 234, resistive layer 236a, insulating layer 238a, conductive layer 240c, and conductive layer 244c constitute a MiM capacitor. Resistive layer 236b provides a resistive element. The individual sections of conductive layer 244 can be wound or coiled in plan-view to produce or exhibit inductive properties. For example, conductive layer 244b, 244d, and 244e constitute a wound or spiral inductor. The IPD structure 272 is isolated by grounding conductive layer 244a and 244e.

An electrically conductive bump material is deposited over the exposed conductive layer 244a and 244e using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 244 using a suitable attachment or bonding process. In one embodiment, the bump material is reflowed by heating the material above its melting point to form spherical balls or bumps 274. In some applications, bumps 274 are reflowed a second time to improve electrical contact to conductive layer 244. A UBM 276 can be formed under bumps 274. The bumps can also be compression bonded to conductive layer 244. Bumps 274 represent one type of interconnect structure that can be formed over conductive layer 244. The interconnect structure can also use bond wires, stud bump, micro bump, or other electrical interconnect.

Shielding layer 262 is formed at the wafer level and covers a top portion and side portions of bulk substrate material 122, around a periphery of semiconductor die 124. Shielding layer 262 is electrically connected through conductive vias 233, conductive layers 244a and 244e and 248, and bumps 224 to an external low-impedance ground point. Shielding layer 262 provides isolation of EMI, RFI, harmonic distortion, and other inter-device interference between SiP 270 and other semiconductor die or components. No separate ground shield cap is required, which reduces manufacturing costs.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a substrate;
   a first insulating layer formed over a first surface of the substrate;
   an integrated passive device (IPD) structure formed over the substrate and first insulating layer;
   a conductive via formed through the IPD structure and partially through the substrate;
   a via formed through a second surface of the substrate opposite the first surface of the substrate and extending to the conductive via; and
   a shielding layer formed over the second surface of the substrate and extending into the via to the conductive via.

2. The semiconductor device of claim 1, wherein the IPD structure includes:
   a first conductive layer formed over the first insulating layer;
   a second insulating layer formed over the first conductive layer; and
   a second conductive layer formed over the second insulating layer.

3. The semiconductor device of claim 2, wherein the first conductive layer, second insulating layer, and second conductive layer constitute a metal-insulator-metal capacitor.

4. The semiconductor device of claim 2, wherein the IPD structure further includes:
   a third insulating layer formed over the second conductive layer and second insulating layer;
   a third conductive layer formed over the second conductive layer; and
   a fourth insulating layer formed over the third conductive layer and third insulating layer.

5. The semiconductor device of claim 4, wherein the third conductive layer is wound to exhibit inductive properties.

6. The semiconductor device of claim 1, wherein the shielding layer is electrically connected through the conductive via to a ground point.

7. A semiconductor device, comprising:
   a substrate;
   an integrated passive device (IPD) structure formed over a first surface of the substrate;
   a first insulating layer formed over the first surface of the substrate;
   a conductive via formed through the first insulating layer;
   a via formed through a second surface of the substrate opposite the first surface of the substrate and extending to the conductive via; and
   a shielding layer formed over the second surface of the substrate and extending into the via to the conductive via.

8. The semiconductor device of claim 7, wherein the IPD structure includes:
   a first conductive layer formed over the substrate;
   a second insulating layer formed over the first conductive layer; and
   a second conductive layer formed over the second insulating layer.

9. The semiconductor device of claim 8, wherein the first conductive layer, second insulating layer, and second conductive layer constitute a metal-insulator-metal capacitor.

10. The semiconductor device of claim 8, wherein the IPD structure further includes:
    a third insulating layer formed over the second conductive layer and second insulating layer;
    a third conductive layer formed over the second conductive layer; and
    a fourth insulating layer formed over the third conductive layer and third insulating layer.

11. The semiconductor device of claim 10, wherein the third conductive layer is wound to exhibit inductive properties.

12. The semiconductor device of claim 7, wherein the shielding layer is electrically connected through the conductive via to a ground point.

13. The semiconductor device of claim 7, further including a second insulating layer formed over the first surface of the substrate.

14. A semiconductor device, comprising:
    a substrate;
    a conductive via formed partially through a first surface of the substrate;
    an integrated passive device (IPD) structure formed over the first surface of the substrate;
    a via formed through a second surface of the substrate opposite the first surface of the substrate and extending to the conductive via; and
    a shielding layer formed over the second surface of the substrate and extending into the via to the conductive via.

15. The semiconductor device of claim 14, wherein the IPD structure includes:
    a first conductive layer formed over the substrate;
    a first insulating layer formed over the first conductive layer; and
    a second conductive layer formed over the first insulating layer.

16. The semiconductor device of claim 15, wherein the first conductive layer, first insulating layer, and second conductive layer constitute a metal-insulator-metal capacitor.

17. The semiconductor device of claim 15, wherein the IPD structure further includes:
    a second insulating layer formed over the second conductive layer and first insulating layer;
    a third conductive layer formed over the second conductive layer; and
    a third insulating layer formed over the third conductive layer and second insulating layer.

18. The semiconductor device of claim 17, wherein the third conductive layer is wound to exhibit inductive properties.

19. The semiconductor device of claim 14, wherein the shielding layer is electrically connected through the conductive via to the IPD structure.

20. The semiconductor device of claim 14, further including an insulating layer formed over the first surface of the substrate.

21. A semiconductor device, comprising:
    a substrate;

an integrated passive device (IPD) structure formed over a first surface of the substrate;

a via formed through a second surface of the substrate opposite the first surface of the substrate; and a shielding layer formed over the second surface of the substrate and extending into the via.

22. The semiconductor device of claim 21, wherein the IPD structure includes:

a first conductive layer formed over the substrate;

a first insulating layer formed over the first conductive layer; and a second conductive layer formed over the first insulating layer.

23. The semiconductor device of claim 22, wherein the IPD structure further includes:

a second insulating layer formed over the second conductive layer and first insulating layer;

a third conductive layer formed over the second conductive layer; and a third insulating layer formed over the third conductive layer and second insulating layer.

24. The semiconductor device of claim 23, wherein the third conductive layer is wound to exhibit inductive properties.

25. The semiconductor device of claim 21, wherein the shielding layer is electrically connected to the IPD structure.

* * * * *